US006958262B2

(12) United States Patent
Miyazaki

(10) Patent No.: US 6,958,262 B2
(45) Date of Patent: Oct. 25, 2005

(54) MOUNTING STRUCTURE OF SEMICONDUCTOR DEVICE AND MOUNTING METHOD THEREOF

(75) Inventor: Hirokazu Miyazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/825,246

(22) Filed: Apr. 16, 2004

(65) Prior Publication Data

US 2004/0227224 A1 Nov. 18, 2004

Related U.S. Application Data

(62) Division of application No. 09/788,596, filed on Feb. 21, 2001, now Pat. No. 6,803,647.

(30) Foreign Application Priority Data

Feb. 25, 2000 (JP) .............................. 2000-049904

(51) Int. Cl.[7] ......................... H01L 21/44; H01L 21/48; H01L 21/50
(52) U.S. Cl. ...................... 438/123; 438/125; 438/126; 438/127; 438/108; 438/613; 438/411
(58) Field of Search ................................ 438/108, 123, 438/126, 611, 613, 125, 127, 411

(56) References Cited

U.S. PATENT DOCUMENTS

| | | | |
|---|---|---|---|
| 5,148,266 A | 9/1992 | Khandros et al. | |
| 5,173,055 A | 12/1992 | Grabbe | |
| 5,440,452 A | 8/1995 | Kitahara et al. | |
| 5,518,964 A | 5/1996 | DiStefano et al. | |
| 6,342,726 B2 | 1/2002 | Miyazaki et al. | |

FOREIGN PATENT DOCUMENTS

| | | |
|---|---|---|
| JP | 62-67829 | 3/1987 |
| JP | 5-206216 | 8/1993 |
| JP | 9-289226 | 11/1997 |
| JP | 10-229147 | 8/1998 |
| JP | 10-284635 | 10/1998 |
| JP | 2000-133749 | 5/2000 |

Primary Examiner—Nitin Parekh
(74) Attorney, Agent, or Firm—Young & Thompson

(57) ABSTRACT

An insulating sheet which connects a semiconductor chip and a wiring substrate is provided between the semiconductor chip and the wiring substrate. The insulating sheet has windows therethrough at positions corresponding to those of connection pads of the wiring substrate and has leads, one end of each of the leads being fixed on the sheet and the other end of each of the leads protruding from the opposite surface of the sheet through a window. Each of solder balls of the semiconductor chip is connected to the fixed one end of one of the leads, and each of the connection pads is connected to the other end of each of the leads to electrically connect the semiconductor chip and the wiring substrate.

2 Claims, 5 Drawing Sheets

MOUNTING STRUCTURE OF SEMICONDUCTOR DEVICE AND MOUNTING METHOD THEREOF

CROSS REFERENCE TO RELATED APPLICATIONS

This application is a division of application Ser. No. 09/788,596, now U.S. Pat. No. 6,803,647, filed on Feb. 21, 2001, the entire contents of which are hereby incorporated by reference.

BACKGROUND OF THE INVENTION

1. Field of the Invention

The present invention relates to a mounting structure of a semiconductor device which can be easily detached from a wiring substrate after being mounted on the wiring substrate and a mounting method thereof.

2. Description of the Related Art

Conventionally, a method is known where a semiconductor chip is mounted on a wiring substrate through solder balls densely provided on one surface of the semiconductor chip. In such a conventional mounting structure of a semiconductor device, resin referred to as underfill is filled into the gap between the semiconductor chip and the wiring substrate. For example, Japanese Patent Application Laid-open No. Hei 10-284635 discloses a semiconductor device in which filling resin is embedded in a gap between a semiconductor chip and a substrate so as to cover solder balls.

With reference to FIG. 7, in such a conventional semiconductor device, a semiconductor chip 21 and a wiring substrate 25 are connected to each other by welded solder balls 26 of the semiconductor chip 21. Further, resin 29 is injected into the gap between the semiconductor chip 21 and the wiring substrate 25 so as to cover the solder balls 26. The resin 29 is injected for the purpose of alleviating the thermal stress caused by the difference in the coefficient of thermal expansion between the semiconductor chip 21 and the wiring substrate 25. The semiconductor chip 21 and the wiring substrate 25 repeat expansion and contraction by heat generated by operations (on/off operation) of the device. However, the coefficient of thermal expansion of the semiconductor chip 21 is about 3.5 ppm whereas the coefficient of thermal expansion of the wiring substrate 25 is about 16 ppm in case of a printed board and about 8 ppm in case of an alumina substrate. Due to this difference in the coefficient of thermal expansion between the semiconductor chip 21 and the wiring substrate 25, the solder balls 26 are alternately subject to compressive stress and tensile stress. As a result, the solder balls 26 are broken at an early stage due to thermal fatigue, which causes electric disconnection, resulting in a signal transmission stop or a power supply stop.

Therefore, by filling the resin 29 into the gap between the semiconductor chip 21 and the wiring substrate 25 so as to cover the solder balls 26. The resin 29 alleviates stress on the solder balls 26. This suppresses the deterioration of the solder balls 26, and the reliability of the connection between the semiconductor chip 21 and the wiring substrate 25 is improved. It is to be noted that epoxy-based resin is mainly used as the resin 29.

However, in the conventional semiconductor device described above, since the semiconductor chip 21 and the wiring substrate 25 are mechanically firmly bonded to each other with the resin 29, once the semiconductor chip 21 is attached to the wiring substrate 25, the semiconductor chip 21 can not be easily detached from the wiring substrate 25. Therefore, there has been a problem in that the semiconductor chip 21 can not be easily replaced and the maintainability is lowered.

An object of the present invention is to provide a mounting structure of a semiconductor device in which a semiconductor chip can be detached from a wiring substrate and high reliability is realized.

According to the present invention, a mounting structure of a semiconductor device with excellent connection reliability can alleviate the stress on solder balls caused by the difference in the coefficient of thermal expansion between a semiconductor chip and a wiring substrate when the semiconductor chip is mounted on the wiring substrate.

Further, according to the present invention, amounting structure of a semiconductor device with excellent maintainability can be provided in which a semiconductor chip can be easily detached from a wiring substrate after the semiconductor chip has been mounted on the wiring substrate.

SUMMARY OF THE INVENTION

According to an aspect of the present invention, in a mounting structure of a semiconductor device, an insulating sheet having a plurality of leads is attached between a semiconductor chip and a wiring substrate, the plurality of leads electrically connecting a plurality of solder balls and a plurality of corresponding connection pads, respectively.

The insulating sheet has holes therethrough at positions corresponding to those of the plurality of connection pads.

One end of each of the plurality of leads is fixed on a first surface of the insulating sheet, while the other end is inserted in one of the holes.

Each of the plurality of solder balls is electrically connected to the fixed one end of a corresponding one of the plurality of leads, while each of the plurality of connection pads is electrically connected to the other end of a corresponding one of the plurality of leads protruding from one of the holes.

According to another aspect of the present invention, a mounting method of a semiconductor device includes providing an insulating sheet having holes therethrough at positions corresponding to those of a plurality of connection pads and having a plurality of leads, one end of each of the plurality of leads being fixed on a first surface of the insulating sheet and the other end of each of the plurality of leads protruding from a second surface of the insulating sheet through one of the holes, electrically connecting the other end of each of the plurality of leads of the insulating sheet to a corresponding one of the plurality of connection pads of a wiring substrate, and electrically connecting each of a plurality of solder balls of a semiconductor chip to the fixed one end of a corresponding one of the plurality of leads.

According to still another aspect of the present invention, an insulating sheet has a plurality of holes therethrough and a plurality of leads, one end thereof being fixed on a first surface of the insulating sheet and the other end thereof being shaped to be afloat in the holes.

According to yet another aspect of the present invention, a method of manufacturing an insulating sheet comprises the steps of providing a metal film on one surface of the insulating sheet, masking and etching the metal film to form a plurality of leads, cutting out predetermined places of the insulating sheet to provide a plurality of holes through the insulating sheet, and making one end of each of the plurality of leads fall into a corresponding one of the plurality of holes.

BRIEF DESCRIPTION OF THE DRAWINGS

These and other objects, features and advantages of the invention will become more fully apparent from the following detailed description taken in conjunction with accompanying drawings.

DESCRIPTION OF THE PREFERRED EMBODIMENTS

Figure 1:
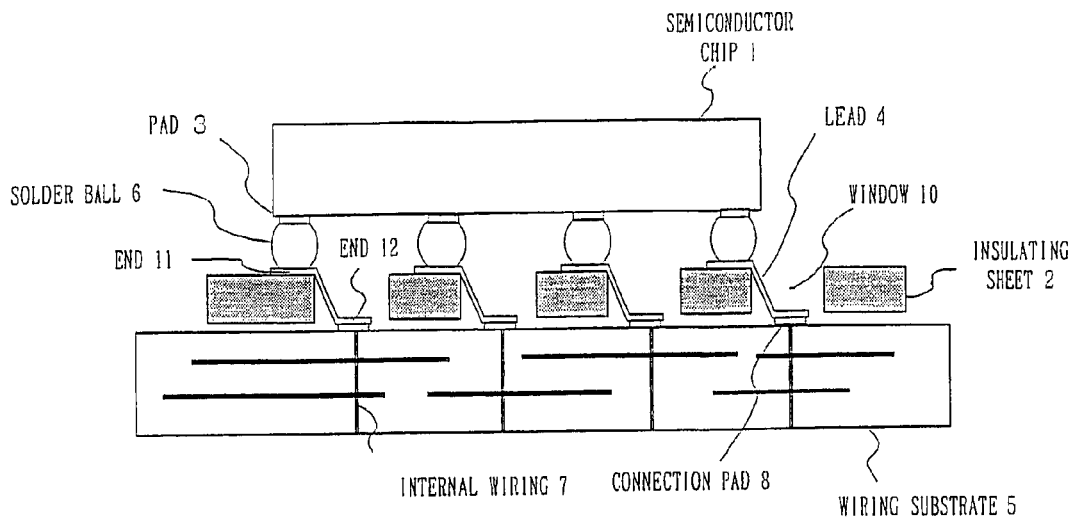
FIG. 1 illustrates the structure of a first embodiment according to the present invention.
Figure 2:
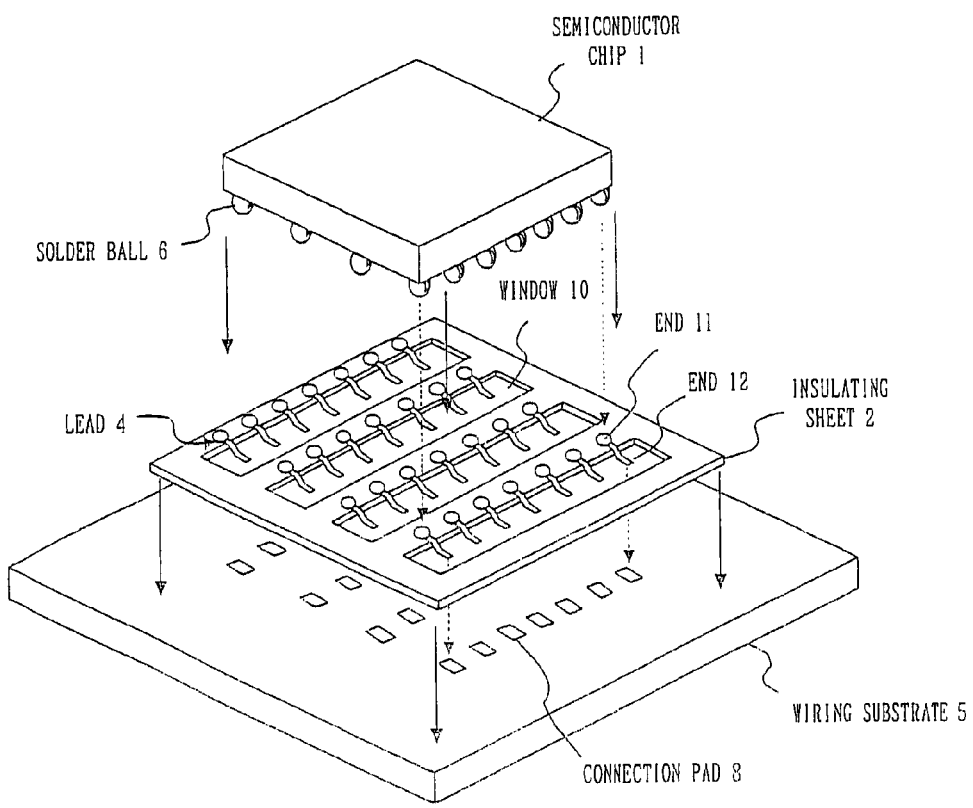
FIG. 2 is a perspective view illustrating the structure of the first embodiment.
Figure 3A:
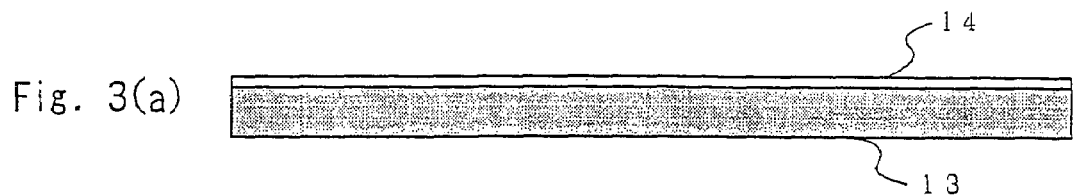
FIGS. 3(a) to 3(e) illustrate a method of manufacturing an insulating sheet.
Figure 3B:
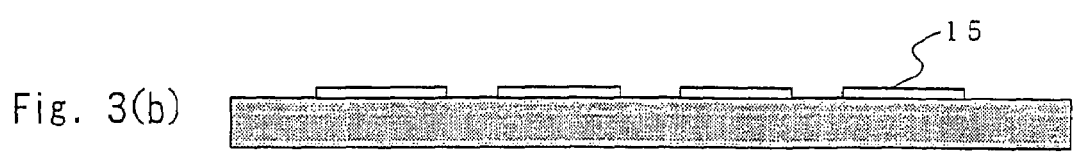
Figure 3C:
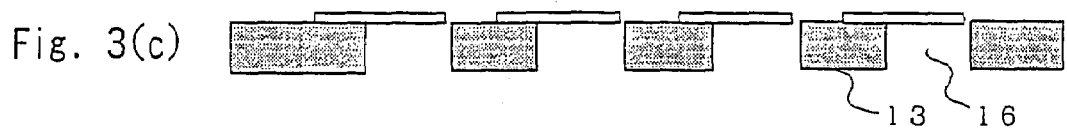
Figure 3D:
Figure 3E:
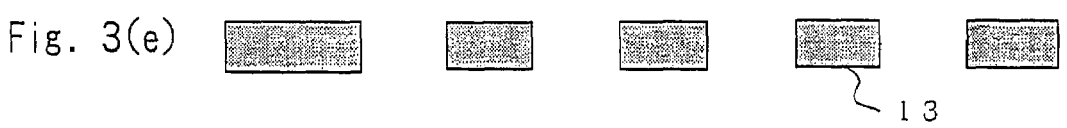

A first embodiment of a mounting structure of a semiconductor device is now described-in-detail with reference to the drawings. With reference to FIGS. 1 and 2, the first embodiment of the present invention includes a semiconductor chip 1, an insulating sheet 2, and a wiring substrate 5.

A plurality of pads 3 for electric connection to the external are arranged to be lattice-like on one surface of the semiconductor chip 1. Solder balls 6 are attached to the plurality of pads 3, respectively. A Stannum/Plumbum(Sn/Pb) alloy, an Stannum/Bismuth/Argentum (Sn/Bi/Ag) alloy, a Stannum/Silver (Sn/Ag) alloy or the like is used for the composition of the solder balls 6.

The wiring substrate 5 has therein internal wirings 7 formed of a conductive material such as Copper (Cu). Further, the wiring substrate 5 has on its surface where the semiconductor chip 1 is mounted a plurality of connection pads 8 corresponding to the pads 3 of the semiconductor chip 1, respectively. The respective plurality of connection pads 8 are connected to the internal wirings 7 to be electrically connected to a power source layer or other components.

The insulating sheet 2 is formed of an insulating material such as polyimide resin, Teflon resin, epoxy resin and alumina at the thickness of about 0.1 mm–0.5 mm. The coefficient of thermal expansion of the insulating sheet should be between the coefficient of thermal expansion of the semiconductor and the coefficient of thermal expansion of the wiring substrate. The insulating sheet 2 also has windows 10 therethrough formed by cutting out places corresponding to the connection pads 8 on the wiring substrate 5. Furthermore, the insulating sheet 2 has a plurality of leads 4, one end (hereinafter referred as a first end)of each leads being fixed on the insulating sheet 2 and the other end (hereinafter referred as a second end) of each leads being inserted into the windows 10 to be in a floated state. First ends 11 of the leads 4 are fixed on the insulating sheet 2 at positions corresponding to the solder balls 6 of the semiconductor chip 1, respectively. Moreover, the leads 4 are curved or bent so that unfixed second ends 12 protrude through the windows 10 from a opposite surface of the insulating sheet 2. The unfixed second ends 12 of the leads 4 are positioned to places corresponding to the places of the connection pads 8 on the wiring substrate 5, respectively.

A method of manufacturing the insulating sheet 2 is described. With reference to FIGS. 3(a) to 3(e), at first, a metal film 14 is formed on an insulating sheet 13 by plating or the like (FIG. 3(a)). Then, using a mask of a desired pattern (in this embodiment, the pattern of leads), the metal film 19 is etched to form leads 15 (FIG. 3(b)). Some parts of the insulating sheet 13 are cut out to provide windows 16 (FIG. 3(c)). Then, one end of each of the leads 15 is made to fall into one of the windows 16 as second end (FIG. 3(d)).

Another method of manufacturing the insulating sheet 2 is as follows. First, the windows 16 are provided in the insulating sheet 13 (FIG. 3(e)). Then, one end of each of the plurality of leads 15 prepared in advance is fixed to the insulating sheet 13 as first end (FIG. 3(c)). After that, the other end of each of the plurality of leads 15 as second end is made to fall into one of the windows 16 (FIG. 3(d)).

A mounting method of the mounting structure of the semiconductor device according to the present invention is described in detail with reference to the drawings.

With reference to FIGS. 4(a) to 4(d), the insulating sheet 2 is mounted on the wiring substrate 5 with the surface of the insulating sheet 2 where second ends 12 are protruding therefrom being facing the wiring substrate 5. Here, the second ends 12 of the leads 4 are aligned and connected to the corresponding connection pads 8 on the wiring substrate 5, respectively (FIG. 4(a)). The second ends 12 may be connected to the connection pads 8 by pressing or soldering. This electrically connects the leads 4 to the wiring substrate 5 below the windows 10 through the second ends 12 and the connection pads 8. Then, the semiconductor chip 1 is mounted on the surface of the insulating sheet 2 which is opposite to the surface connected to the wiring substrate 5, that is, on the surface of the insulating sheet 2 having first ends 11 fixed thereto. The solder balls 6 are aligned and connected by welding to the corresponding the first ends 11, respectively (FIG. 4(b)). This electrically connects the semiconductor chip 1 to the wiring substrate 5 through the leads 4 provided on the insulating sheet 2, which makes it possible to input/output an electric signal and supply power between the semiconductor chip 1 and the wiring substrate 5.

According to the first embodiment of the present invention, since the first ends 11 of the leads 4 are formed on the insulating sheet 2, even when the solder balls 6 are welded and mounted onto the first ends 11 of the insulating sheet 2, sufficient connection strength can be maintained. Furthermore, the connection pads 8 are connected to the unfixed second ends 12 of the leads 4. Therefore, even when the wiring substrate 5 is deformed and stress is caused, the resilience of the leads 4 can absorb and alleviate the stress.

Therefore, even when thermal stress is caused by the difference in the coefficient of thermal expansion between the semiconductor chip 1 and the wiring substrate 5, the resilience of the leads 4 absorbs the stress to alleviate the stress on the solder balls 6. Accordingly, disconnection at the solder balls 6 is prevented to improve the reliability of the connection.

As a result, the necessity to encapsulate the solder balls 6 of the semiconductor chip 1 with resin or the like is eliminated, and thus, even after the semiconductor chip 1 is mounted on the wiring substrate 5, the semiconductor chip 1 can be easily detached from the wiring substrate 5 by fusing the solder balls 6. Therefore, the maintainability of the semiconductor chip 1 is improved.

It is to be noted that the leads 4 provided for the insulating sheet 2 may be any resilient conductive material, including Cu and Au.

It is preferable that the first ends 11 of the leads 4, to which the solder balls 6 are to be welded, are appropriately processed into a circular shape, a polygonal shape or the like to fit the shape of the solder balls 6.

Figure 5:
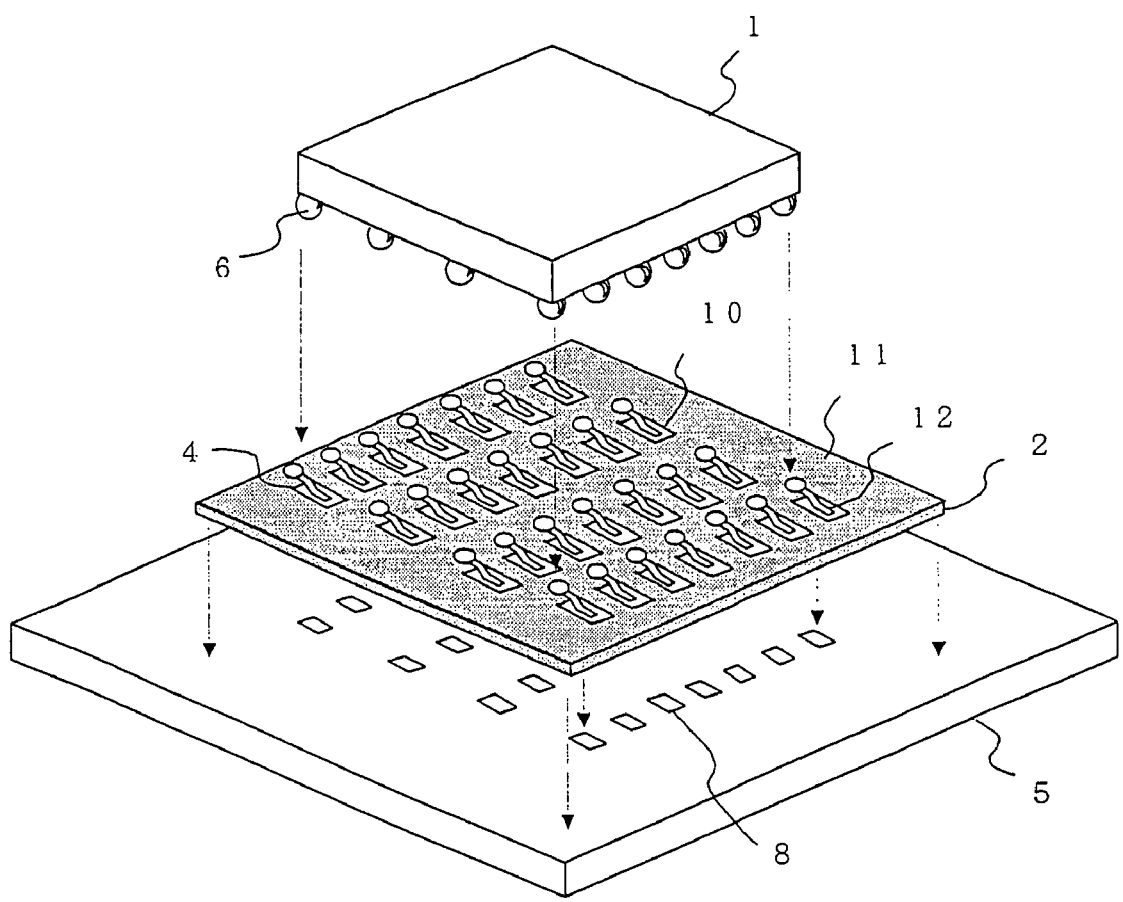
FIG. 5 illustrates another structure of an insulating sheet.

Furthermore, With reference to FIG. 5, though FIG. 2 illustrates the structure where one window 10 is provided with regard to the plurality of connection pads 8, the structure may be that a window is provided with regard to each of the connection pads 8.

Next, a second embodiment according to the present invention is described in detail with reference to the drawings.

Figure 6:
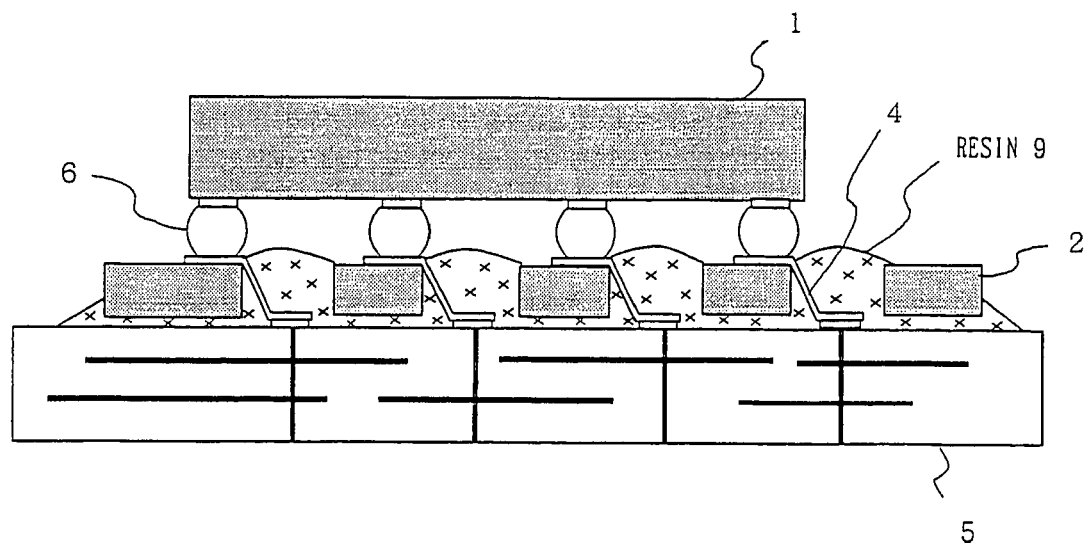
FIG. 6 illustrates the structure of a second embodiment according to the present invention.
Figure 7:
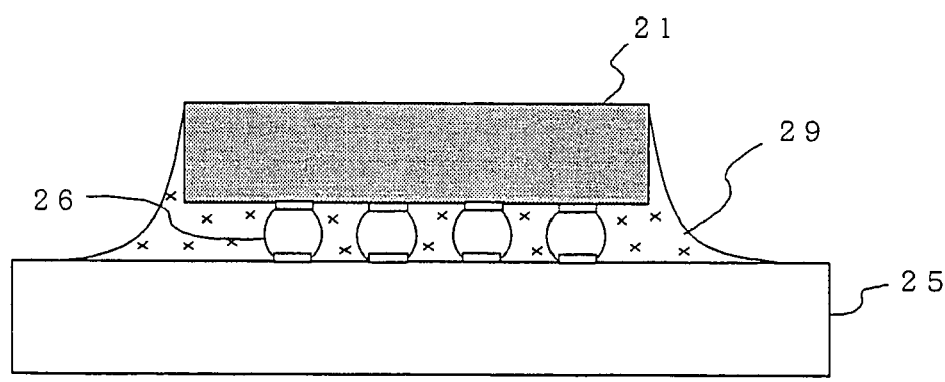
FIG. 7 illustrates a conventional structure of a semiconductor device.

With reference to FIG. 6, similarly to the structure of the first embodiment, connection pads 8 on a wiring substrate 5 are connected to second ends 12 of leads 4, and first ends 11 of the leads 4 are connected to solder balls 6 of a semiconductor chip 1 by welding the solder balls 6, respectively.

However, the second embodiment differs from the first embodiment in that resin 9 for encapsulation is filled into the gap between the wiring substrate 5 and an insulating sheet 2 and into windows 10 in the insulating sheet 2 when the wiring substrate 5 is connected to the insulating sheet 2.

This can reinforce the connection between the second ends 12 of the leads 4 and the connection pads 8. Thus, the connection between the insulating sheet 2 and the wiring substrate 5 can be ensured. Furthermore, the resilience of the resin 9 is added to the resilience of the leads 4, which further alleviates stress.

Figure 4A:
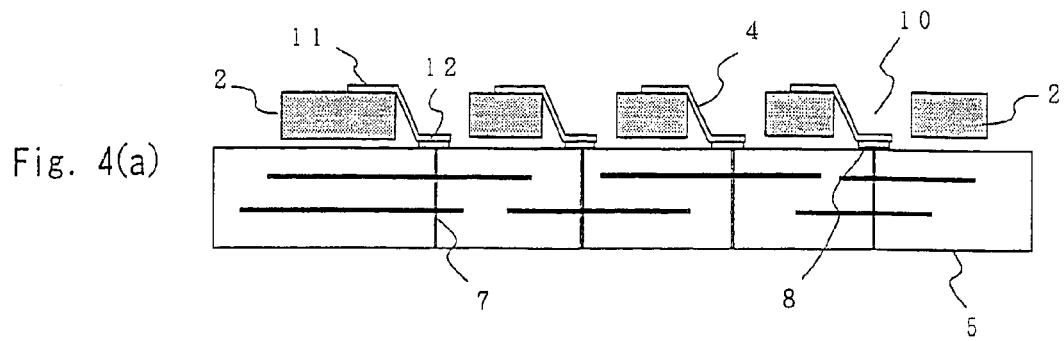
FIGS. 4(a) to 4(d) illustrate a mounting method of the mounting structure according to the first embodiment.
Figure 4B:
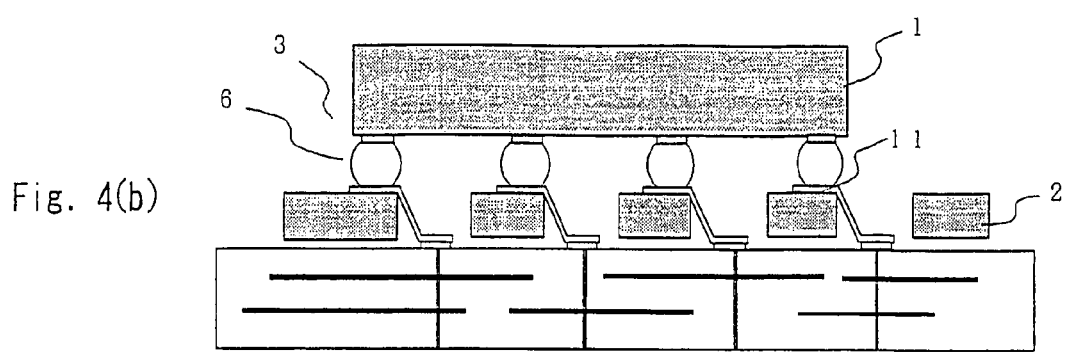
Figure 4C:
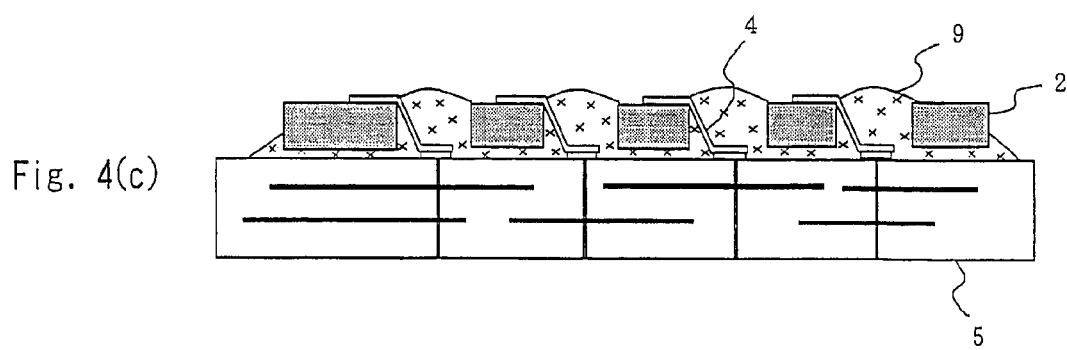
Figure 4D:
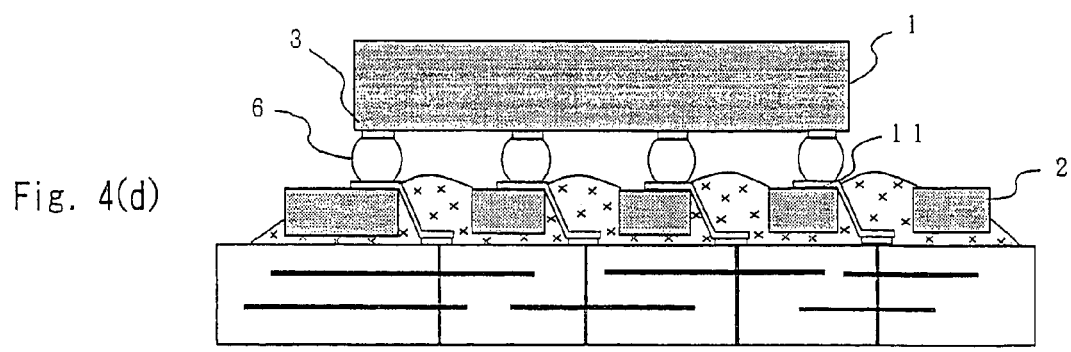

In this case, after the second ends 12 are connected to the connection pads 8 as illustrated in FIG. 4(a), the resin 9 is filled into the gap between the insulating sheet 2 and the wiring substrate 5 and into the windows 10 (FIG. 4(c)). After that, the first ends 11 are connected to the solder balls 6, and the semiconductor chip 1 is mounted on the insulating sheet 2 (FIG. 4(d)).

According to the second embodiment, similarly to the case of the first embodiment, since the leads 4 absorb and alleviate the thermal stress caused between the semiconductor chip 1 and the wiring substrate 5, the stress on the solder balls 6 is alleviated to improve the reliability of the connection.

Furthermore, even after the semiconductor chip 1 is mounted on the wiring substrate 5, the semiconductor chip 1 can be easily detached from the wiring substrate 5 by fusing the solder balls 6, which improves the maintainability.

Moreover, by filling the resin 9 for encapsulation into the gap between the wiring substrate 5 and the insulating sheet 2 and into the windows 10 in the insulating sheet 2, the connection between the second ends 12 and the connection pads 8 can be ensured without impairing the resilience of the leads 4.

As is clear from the above description, according to the present invention, by utilizing the resilience of the leads of the insulating sheet, the thermal stress caused by the difference in the coefficient of thermal expansion between the semiconductor chip and the wiring substrate can be absorbed. As a result, the stress on the solder balls is alleviated to improve the reliability of the connection between the semiconductor chip and the wiring substrate.

Furthermore, since the necessity to cover the solder balls with resin is eliminated, even after the semiconductor chip is mounted on the wiring substrate, the semiconductor chip can be easily detached from the wiring substrate by fusing the solder balls. Therefore, the semiconductor chip can be easily replaced, which improves the maintainability of the semiconductor device.

Moreover, by filling the resin for encapsulation into the gap between the wiring substrate and the insulating sheet and into the windows in the insulating sheet, the connection between the leads and the connection pads can be ensured without impairing the resilience of the leads.

Furthermore, the structure where the insulating sheet is sandwiched between the semiconductor chip and the wiring substrate makes it possible to mount the semiconductor chip on various wiring substrates of various shapes, which enhances the degree of freedom of the semiconductor device.

While the present invention and its advantages have been described in conjunction with preferred embodiments in the above detailed descriptions, the present invention is not limited thereto, and various changes, substitutions and alternations can be made therein without departing from spirits and scope of the inventions as defined by the appended claims.

What is claimed is:

1. A mounting method of a semiconductor device for mounting a semiconductor chip provided with a plurality of solder balls on a wiring substrate provided with a plurality of connection pads, comprising:

providing an insulating sheet having holes corresponding to said connection pads and having a plurality of leads, one end of each of said leads being fixed on a first surface of said insulating sheet and the other end of each of said leads protruding from a second surface of said insulating sheet through one of said holes;

electrically connecting said other end of each of said leads of said insulating sheet to a corresponding one of said connection pads; and electrically connecting each of said solder balls to said fixed one end of a corresponding one of said leads.

2. The mounting method of a semiconductor device as claimed in claim 1, further comprising:

filling resin into the gap between said insulating sheet and said wiring substrate after connecting said other end of each of said leads to a corresponding one of said connection pads.

* * * * *